United States Patent
Neuman et al.

(10) Patent No.: US 9,814,142 B1
(45) Date of Patent: Nov. 7, 2017

(54) ELECTRONIC DEVICES WIRE BONDED TO SUBSTRATE THROUGH AN ADHESIVE LAYER AND METHOD OF MAKING THE SAME

(71) Applicant: AUTOMATED ASSEMBLY CORPORATION, Lakeville, MN (US)

(72) Inventors: David Neuman, Randolph, MN (US); Scott Lindblad, Lakeville, MN (US)

(73) Assignee: Automated Assembly Corporation, Lakeville, MN (US)

( * ) Notice: Subject to any disclaimer, the term of this patent is extended or adjusted under 35 U.S.C. 154(b) by 132 days.

(21) Appl. No.: 14/749,214

(22) Filed: Jun. 24, 2015

(51) Int. Cl.
- *H05K 1/18* (2006.01)
- *H05K 1/03* (2006.01)
- *H05K 3/30* (2006.01)
- *H05K 3/34* (2006.01)
- *H05K 3/00* (2006.01)

(52) U.S. Cl.
CPC .......... *H05K 1/189* (2013.01); *H05K 1/0313* (2013.01); *H05K 1/0393* (2013.01); *H05K 1/181* (2013.01); *H05K 3/0026* (2013.01); *H05K 3/305* (2013.01); *H05K 3/341* (2013.01); *H05K 2201/0145* (2013.01); *H05K 2201/0154* (2013.01); *H05K 2201/10015* (2013.01); *H05K 2201/10022* (2013.01); *H05K 2201/10098* (2013.01); *H05K 2201/10106* (2013.01); *H05K 2201/10287* (2013.01); *H05K 2203/049* (2013.01)

(58) Field of Classification Search
CPC ...... H01L 23/13; H01L 21/485–21/486; H01L 21/15; H01L 26/03; H01L 26/105; H01L 23/3677; H05K 1/141–1/144

USPC ............... 361/760–777, 795; 257/675–730, 257/788–790; 174/259–264

See application file for complete search history.

(56) References Cited

U.S. PATENT DOCUMENTS

| | | | | |
|---|---|---|---|---|
| 5,173,766 A | * | 12/1992 | Long | H01L 21/50 257/668 |
| 5,461,545 A | * | 10/1995 | Leroy | H05K 3/284 174/17.05 |
| 5,631,191 A | * | 5/1997 | Durand | H01L 23/49572 156/311 |
| 6,329,228 B1 | * | 12/2001 | Terashima | H01L 21/486 257/675 |
| 6,790,760 B1 | * | 9/2004 | Cohn | H01L 23/13 257/678 |
| 7,408,261 B2 | * | 8/2008 | Yoon | H01L 21/4853 257/737 |
| 7,573,131 B2 | * | 8/2009 | Cui | H01L 23/13 257/707 |

(Continued)

*Primary Examiner* — Tuan T Dinh
(74) *Attorney, Agent, or Firm* — Crawford Maunu PLLC

(57) ABSTRACT

A disclosed circuit arrangement includes a substrate having first bond pads coupled to a pattern of conductors. The first bond pads and the pattern of conductors are disposed on a first surface of the substrate. A first layer of adhesive is directly disposed on the first surface of the substrate and the pattern of conductors and has openings at the first bond pads. An electronic device has opposing first and second surfaces and is attached to the first surface of the substrate by the first surface of the electronic device in contact with the first layer of adhesive. The second surface of the electronic device has second bond pads. Bond wires are connected at the first bond pads through the openings in the first layer of adhesive and connected at the second bond pads.

21 Claims, 3 Drawing Sheets

(56) References Cited

U.S. PATENT DOCUMENTS

| | | | |
|---|---|---|---|
| 2004/0119158 A1* | 6/2004 | Tatt | H01L 23/3677 257/707 |
| 2007/0289127 A1* | 12/2007 | Hurwitz | H01L 21/4857 29/827 |
| 2010/0002405 A1* | 1/2010 | Hsu | H01L 23/13 361/764 |
| 2011/0031607 A1* | 2/2011 | Lin | H01L 25/03 257/692 |
| 2013/0277841 A1* | 10/2013 | Lii | H01L 25/105 257/741 |

* cited by examiner

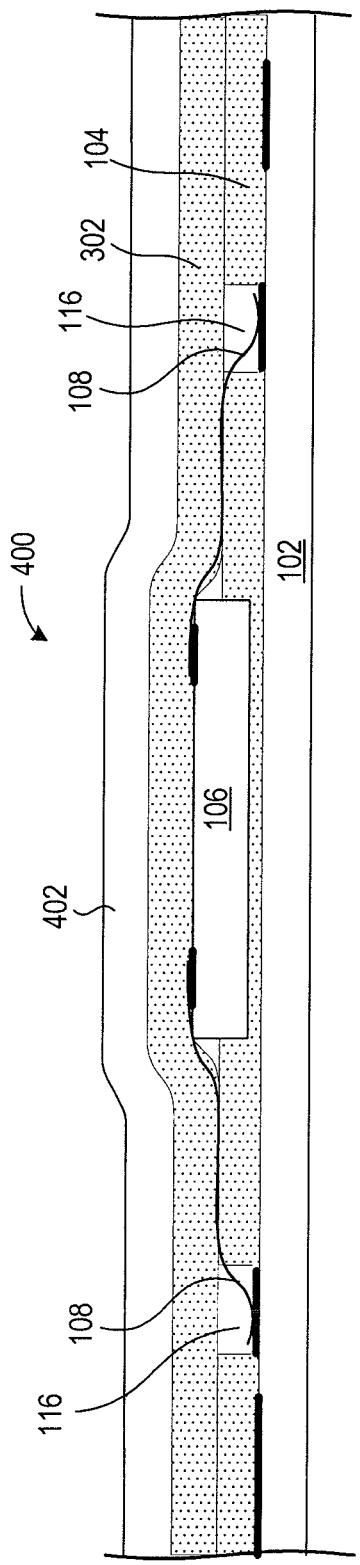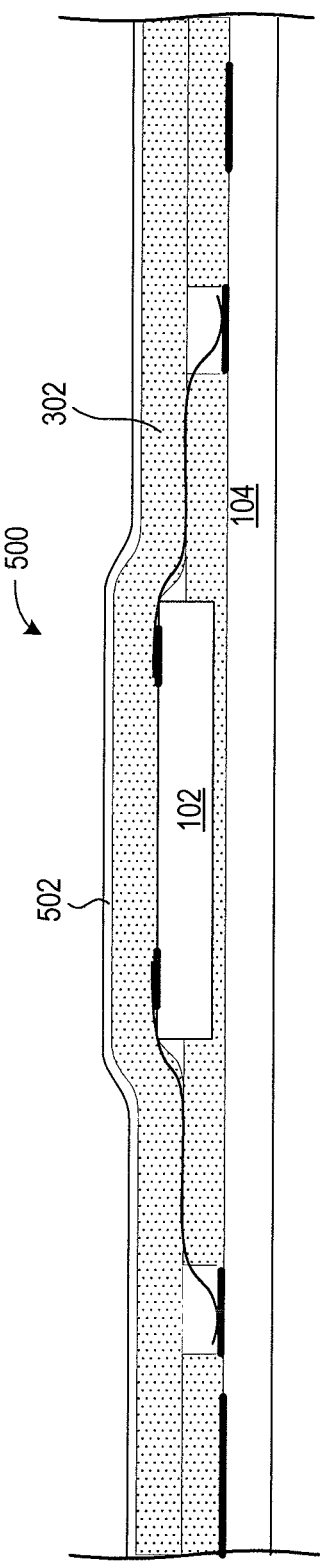

ELECTRONIC DEVICES WIRE BONDED TO SUBSTRATE THROUGH AN ADHESIVE LAYER AND METHOD OF MAKING THE SAME

FIELD OF THE INVENTION

The disclosure describes wire bonding electronic devices to circuitry on a substrate.

BACKGROUND

Flexible circuit structures, or "flexible circuits" for short, are used in a variety of applications, including, for example, automotive, portable computers, cameras, and military and avionics. Flexible circuits offer a compact footprint and reduced weight as compared to circuits built on rigid substrates. In applications in which a rigid planar structure would not physically fit in the desired space or in applications in which the circuit structure is repeatedly flexed during use, flexible circuits meet requirements that rigid structures cannot.

In applications involving repeated flexing of the flexible circuit, designers give particular attention to the durability of the structure of the flexible circuit. Through repeated flexing, a flexible circuit may fail, such as with broken conductors on the flexible substrate of the flexible circuit. In an effort to add durability, the conductors of the flexible substrate may be placed near the neutral axis of the flexible circuit, which may require additional dielectric layers over the conductors.

SUMMARY

The above summary is not intended to describe each disclosed embodiment. The figures and detailed description that follow provide additional example embodiments.

In one embodiment, a circuit arrangement includes a substrate having first bond pads coupled to a pattern of conductors. The first bond pads and the pattern of conductors are disposed on a first surface of the substrate. A first layer of adhesive is directly disposed on the first surface of the substrate and the pattern of conductors and has openings at the first bond pads. An electronic device has opposing first and second surfaces and is attached to the first surface of the substrate by the first surface of the electronic device in contact with the first layer of adhesive. The second surface of the electronic device has second bond pads. Bond wires are connected at the first bond pads through the openings in the first layer of adhesive and connected at the second bond pads.

A method of making a circuit arrangement includes attaching a first layer of adhesive to a substrate. The first layer of adhesive covers bond pads and a pattern of conductors on a first surface of the substrate. In the method, openings are formed in the first layer of adhesive. The openings are aligned with the bond pads. An electronic device is attached to the substrate on the first layer of adhesive, and the electronic device is wire bonded to the bond pads.

BRIEF DESCRIPTION OF THE DRAWINGS

Other aspects and advantages will become apparent upon review of the Detailed Description and upon reference to the drawings in which:

FIG. 4 shows a flexible circuit arrangement having a second layer of adhesive attached to the first layer of adhesive and a flexible liner attached to the second layer of adhesive;

FIG. 5 shows a flexible circuit arrangement having an ink film disposed directly on a second layer of adhesive;

DETAILED DESCRIPTION

Figure 1:
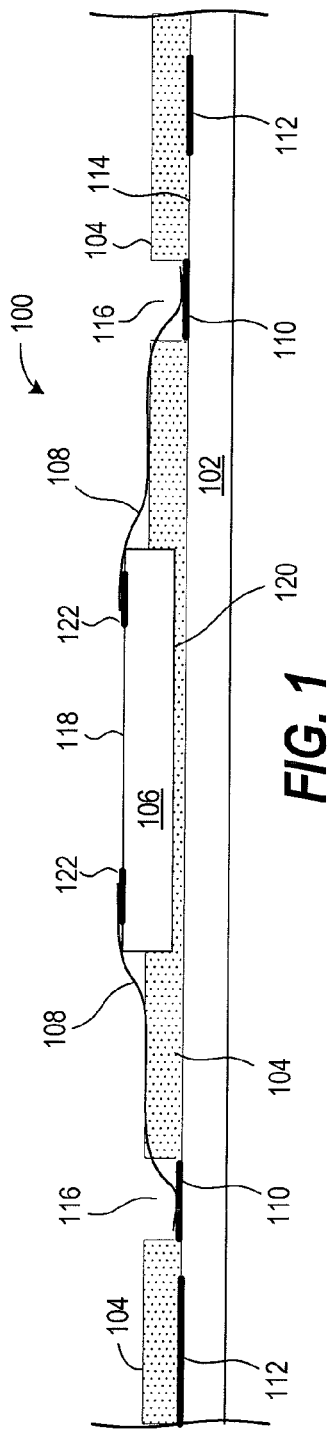
FIG. 1 shows a flexible circuit arrangement according to one implementation option.

In the following description, numerous specific details are set forth to describe specific examples presented herein. It should be apparent, however, to one skilled in the art, that one or more other examples and/or variations of these examples may be practiced without all the specific details given below. In other instances, well known features have not been described in detail so as not to obscure the description of the examples herein. For ease of illustration, the same reference numerals may be used in different diagrams to refer to the same elements or additional instances of the same element.

Though making a flexible circuit having conductors proximate the neutral axis reduces stress on the conductors, the flexible circuit may be prone to failure in other areas. For example, electronic devices may be mounted on a flexible substrate and connected to the conductors on the substrate by wire bonding. If certain parts of the structure are rigid, bond wires or connections of the bond wires to bond pads on the substrate or to bond pads on an electronic device may break as a result of repeated flexing.

Current approaches to making flexible circuits may be costly and result in structures that are inflexible. In one manufacturing approach, a stencil is made having openings that align with bond pads on the substrate. Solder paste is applied through the openings in the stencil to the bond pads, the stencil is removed from the substrate, and electronic devices are connected to the bond pads with solder joints. Due to variability in flexible substrates, numerous stencils are often required to accurately align to the bond pads on the substrate.

Rigid structures on the flexible circuit may reduce the durability of the structure. In one approach a spot of adhesive is jetted to the substrate, and the electronic device is placed on the spot of adhesive. After curing the adhesive, the electronic device may be wire bonded to bond pads on the flexible substrate. The electronic device, bond wires and connections may be encapsulated and the encapsulant cured, resulting in a solid structure. Though the solid structure may protect the electronic device and bonds against impactful forces, the rigidity may create stress points at the edges of the encapsulant when the substrate flexes and reduce the service life of the product.

The disclosure describes structures and methods that provide a durable flexible circuit arrangement with reduced costs of manufacturing. The circuit arrangements include a flexible substrate having bond pads coupled to a pattern of conductors. Both the bond pads and the pattern of conductors are disposed on a surface of the flexible substrate. A layer of adhesive is disposed directly on the surface of the flexible substrate and the pattern of conductors. The layer of adhesive has openings that are aligned with the bond pads. An electronic device has opposing first and second surfaces and is attached to the surface of the flexible substrate by the first surface of the electronic device in contact with the layer of adhesive. The second surface of the electronic device, which faces away from the substrate and adhesive layer, has bond pads. Bond wires connect the bond pads of the flexible substrate through the openings in the layer of adhesive, to the bond pads on the electronic device.

The disclosed circuit arrangements provide improved durability by locating bond pads and bond wires proximate the neutral axis of a resulting structure. An additional layer of adhesive and a flexible liner may be attached to the first layer of adhesive and over the electronic device(s) and bond wires, and covering the openings in the first adhesive layer. The additional layers result in the bond pads and bond wires being located proximate the neutral axis.

In a method of making a circuit arrangement, a layer of adhesive is attached to a flexible substrate. The layer of adhesive covers bond pads and a pattern of conductors that are on a surface of the flexible substrate. Openings in the first layer of adhesive are formed either before or after the adhesive layer is attached to the substrate. The openings are aligned with the bond pads on the substrate. One or more electronic devices are attached to the flexible substrate on the layer of adhesive. The electronic device(s) is wire bonded to the bond pads through the openings in the adhesive layer. Attaching the electronic device to the substrate with a pressure-sensitive adhesive preserves flexibility in the area around the electronic device and wire bond connections, as well as provides a low-cost manufacturing option. Additional layers of adhesive and/or flexible liners may be attached to the layer of adhesive and over the electronic device, which places the bond wires and connections nearer the neutral axis of the flexible circuit structure.

Though many of the disclosed approaches are especially beneficial in flexible circuit arrangements, the disclosed approaches may also benefit rigid circuit arrangements. That is, manufacturing costs may be reduced for making a circuit arrangement including a rigid substrate such as a printed circuit board. As the sizes of features on rigid substrates continues to shrink, applying solder through a solder mask to bond pads on the substrate becomes more challenging because openings in the solder mask shrink along with the size of the bond pads. No solder paste is required for wedge bonding electronic components to the bond pads on the rigid substrate. The adhesive layer may be beneficial for protecting components on the substrate and for attaching a liner layer for further protection. Though the description refers to flexible substrates in the figures, it will be appreciated that a rigid substrate may be substituted for other applications.

FIG. 1 shows a flexible circuit arrangement according to one implementation option. The flexible circuit arrangement 100 includes a flexible substrate 102, a layer of adhesive 104, an electronic device 106, and bond wires 108. The substrate 102 has bond pads 110, which are connected to a pattern of conductors 112. The bond pads 110 and pattern of conductors 112 are disposed on surface 114 of the substrate. The layer of adhesive 104 has openings 116 that are aligned with the bond pads 110.

The flexible substrate may be any substrate that is suitable for the intended application. Examples include polyimide, polyester, polyethylene terephthalate (PET), a polyelectrolyte multilayers (PEMs), paper, a high-density polyethylene, ora vinyl. The bond pads 110 and pattern of conductors 112 may be copper that has been printed and etched on the surface 114 of the substrate.

The layer of adhesive 104 may be a pressure-sensitive adhesive, a B-stage adhesive or other type of adhesive suitable for application requirements. The layer of adhesive is disposed directly on the surface 114 of the flexible substrate and on the pattern of conductors 112. The bond pads 110 are exposed for wire bonding through the openings 116, which are aligned with the bond pads. The openings may be formed before or after the layer of adhesive has been attached to the substrate, such as by masking and chemical removal of material, robotically controlled laser removal of material, or by mechanically cutting holes in the adhesive according to a layout of the bond pads.

The electronic device 106 has opposing surfaces 118 and 120. The electronic device is attached to the surface 114 of the flexible substrate by the surface 120 of the electronic device in contact with the layer of adhesive 104. The surface 118 of the electronic device has bond pads 122 for connecting to the bond pads 110. "Electronic devices" as used herein refers to integrated circuit (IC) components as well as to discrete components such as capacitors, resistors, etc. The disclosed flexible circuit arrangements may be especially suitable for applications in which the electronic device is an RF transponder or an LED, for example.

Middle portions of the bond wires 108 are disposed directly on the adhesive layer, and first end portions of the bond wires connect to the bond pads 110 through the openings 116 in the adhesive layer, and second end portions connect to the bond pads 122 on the electronic device. The bond wires may be round or flat, depending on application requirements. That is, the bond wires may have a round cross section or may be ribbon-type. The bond wires may be aluminum, copper, gold, or gold-coated copper.

Figure 2:
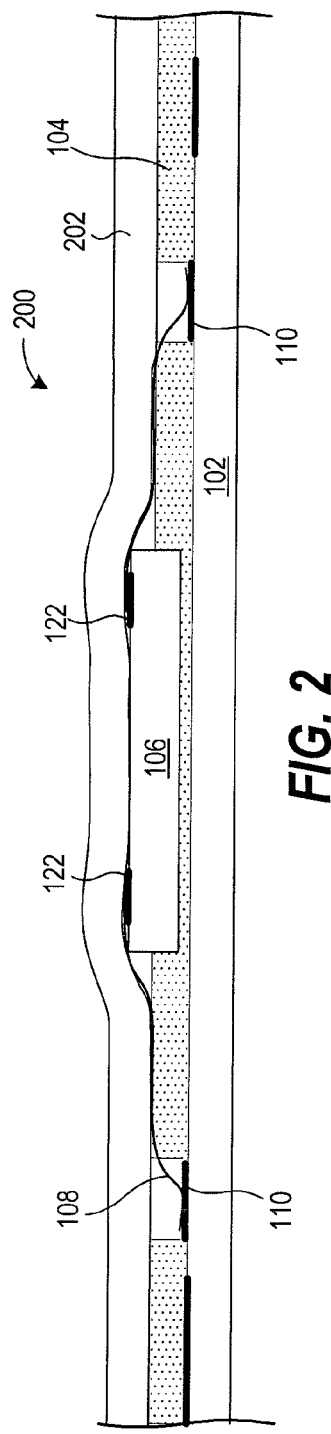
FIG. 2 shows a flexible circuit arrangement having a flexible liner attached to the layer of adhesive.

FIG. 2 shows a flexible circuit arrangement 200 having a flexible liner 202 attached to the layer of adhesive 104. The flexible liner may be a release liner or permanently attached to the adhesive layer, and may be disposed directly on the electronic device, bond wires, and first layer of adhesive and covering the openings in the first layer of adhesive.

The addition of the flexible liner 202 positions the bond wires 108 and connections of the bond pads 122 to the bond wires nearer the neutral axis as compared to the flexible circuit structure 100 of FIG. 1. The bond wires and connections are less susceptible to breaking, because there is less stress along the neutral axis than along axes nearer the outer surface of the structure when the structure is flexed.

Figure 3:
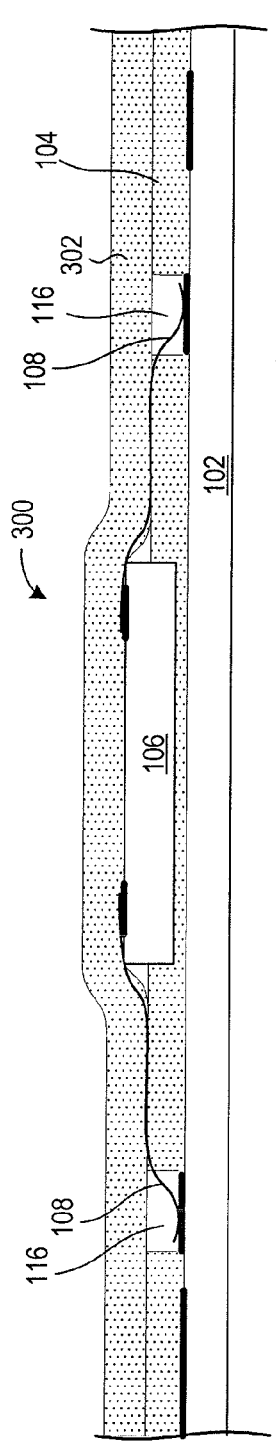
FIG. 3 shows a flexible circuit arrangement having a second layer of adhesive attached to the first layer of adhesive.

FIG. 3 shows a flexible circuit arrangement 300 having a second layer of adhesive 302 attached to the first layer of adhesive 104. The second layer of adhesive 302 may be directly disposed on and attached to the electronic device 106, bond wires 108, and the first layer of adhesive 104. The second layer of adhesive 302 covers the openings 116 in the first layer of adhesive 104. In one implementation, both the first and second layers of adhesive may be pressure sensitive adhesives, B-stage adhesive or other type of adhesive. The thickness of the second layer of adhesive 302 may be equal to the thickness of the first layer of adhesive 104, which positions the bond wires 108 proximate the neutral axis of the flexible circuit arrangement.

FIG. 4 shows a flexible circuit arrangement 400 having a second layer of adhesive 302 attached to the first layer of adhesive 104 and a flexible liner 402 attached to the second layer of adhesive 302. The flexible liner 402 may be a release liner or permanently attached to the adhesive layer 302. The flexible circuit arrangement 400 may be roll pressed to expel gases from the structure and collapse the openings 116, with the voids being filled with adhesive from layers 104 and 302.

FIG. 5 shows a flexible circuit arrangement 500 having an ink film 502 disposed directly on a second layer of adhesive 302. The ink film may present graphics and/or text.

Figure 6:
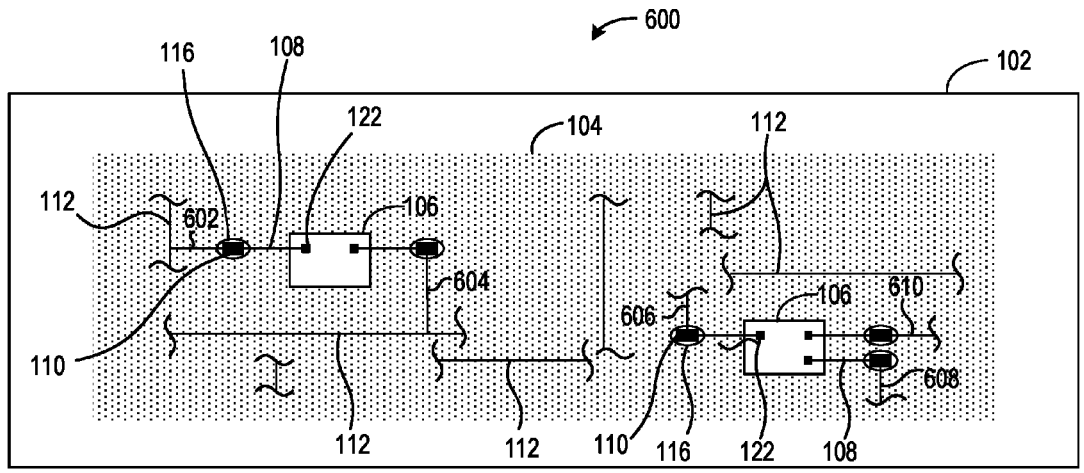
FIG. 6 shows a plan view of a flexible circuit arrangement.

FIG. 6 shows a plan view of a flexible circuit arrangement 600. The flexible circuit arrangement 600 includes a flexible substrate 102, a layer of adhesive 104, electronic devices 106, and bond wires 108. The substrate 102 has bond pads 110, which are connected to a pattern of conductors 112, such as by exemplary connections 602, 604, 606, 608, and 610. Note that only portions of the pattern of conductors 112 are illustrated. The layer of adhesive 104 has openings 116 that are aligned with the bond pads 110.

Figure 7:
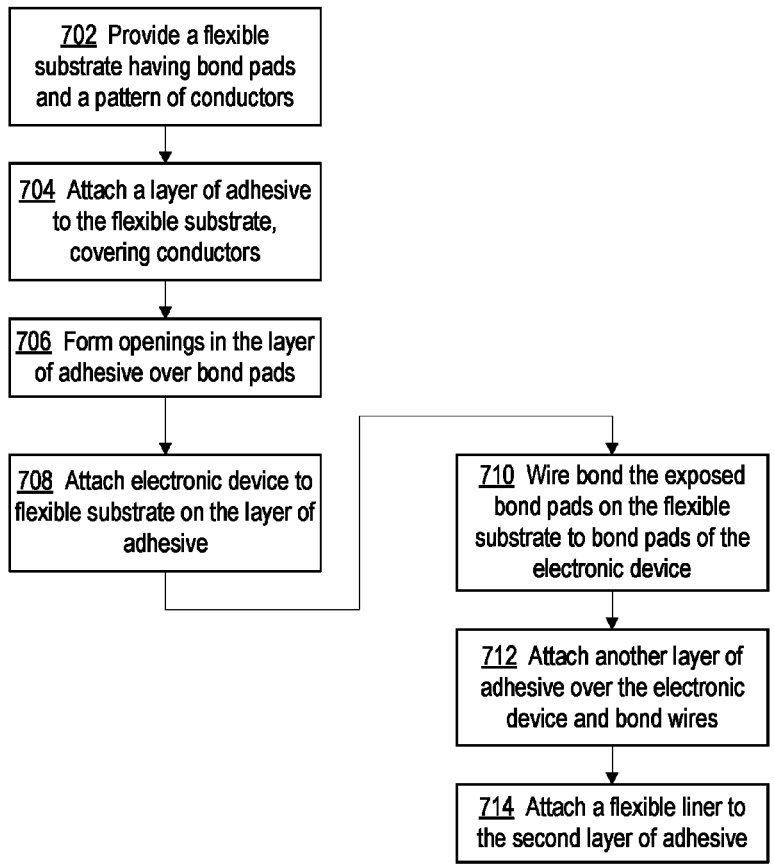
FIG. 7 shows a flowchart of a process for making a flexible circuit arrangement.

FIG. 7 shows a flowchart of a process for making a flexible circuit arrangement. At block 702, a flexible substrate is provided. The flexible substrate, as described above, has bond pads and a pattern of conductors disposed on a surface of the substrate. At block 704, a layer of adhesive is attached to the flexible substrate. The layer of adhesive covers the pattern of conductors and may be a pressure-sensitive adhesive, B-stage adhesive or other type of adhesive.

At block 706, openings are formed in the layer of adhesive such that the openings align with the bond pads on the flexible substrate. In one approach, the openings are formed after the adhesive layer is attached to the flexible substrate. The openings may be formed before or after the layer of adhesive has been attached by the substrate, such as by masking and chemical removal of material, robotically controlled laser removal of material, or by mechanically cutting holes in the adhesive according to a layout of the bond pads.

At block 708, one or more electronic devices are attached to the flexible substrate at locations required by the circuitry on the substrate using processes suitable for the type of adhesive.

The electronic device(s) is wire bonded to the bond pads on the flexible substrate at block 710. The bond pads of the flexible substrate are exposed for wire bonding through the openings formed at block 706. Depending on application requirements, the bond wires may be wedge bonded or ball bonded to the bond pads.

After wire bonding, the adhesive layer, electronic device, and wire bonds may be covered with another adhesive layer and/or a flexible liner. At block 712, a second layer of adhesive is attached to the first layer of adhesive. The second layer of adhesive may also be a pressure-sensitive adhesive and covers the electronic device(s), bond wires, and the openings in the first layer of adhesive.

At block 714, a flexible liner is attached to the second layer of adhesive. In an alternative implementation, the second layer of adhesive may be omitted, and the flexible liner may be attached to the first layer of adhesive. The flexible liner may be a release liner or permanently attached to the first or second layer of adhesive.

The present invention is thought to be applicable to a variety of applications. Other aspects and embodiments will be apparent to those skilled in the art from consideration of the specification and practice of the circuits and methods disclosed herein. It is intended that the specification and illustrated embodiments be considered as examples only, with a true scope of the invention being indicated by the following claims.

What is claimed is:

1. A circuit arrangement, comprising:
a substrate having first bond pads coupled to a pattern of conductors, wherein the first bond pads and the pattern of conductors are disposed on a first surface of the substrate;
a first layer of adhesive disposed directly on the first surface of the substrate and the pattern of conductors, the first layer of adhesive having openings at the first bond pads, opposing first and second surfaces, and the openings extending from the first surface of the first layer of adhesive to the second surface of the first layer of adhesive;
an electronic device having opposing first and second surfaces, the electronic device attached to the first surface of the substrate by the first surface of the electronic device in contact with the first layer of adhesive, and the second surface of the electronic device having second bond pads;
bond wires connected at the first bond pads through the openings in the first layer of adhesive and connected at the second bond pads, wherein portions of the bond wires are disposed directly on the first layer of adhesive; and
a second layer of adhesive disposed directly on the electronic device, bond wires, and first layer of adhesive and covering the openings in the first layer of adhesive.

2. The circuit arrangement of claim 1, wherein the substrate is a flexible substrate and further comprising a flexible liner disposed directly on the second layer of adhesive.

3. The circuit arrangement of claim 1, wherein the first and second layers of adhesive are one of a pressure sensitive adhesive or a B-stage adhesive.

4. The circuit arrangement of claim 1, wherein the first layer of adhesive is one of a pressure sensitive adhesive or a B-stage adhesive.

5. The circuit arrangement of claim 1, wherein the electronic device is one of an RF transponder, an LED, or a discrete component.

6. The circuit arrangement of claim 1, wherein the bond wires are round wires.

7. The circuit arrangement of claim 1, wherein the bond wires are flat bond wires.

8. The circuit arrangement of claim 1, wherein the substrate is one of a polyimide, polyester, polyethylene terephthalate (PET), a polyelectrolyte multilayers (PEMs), paper, a high-density polyethylene, or a vinyl.

9. The circuit arrangement of claim 1, wherein the substrate is a flexible substrate and further comprising a flexible liner disposed directly on the electronic device, bond wires, and first layer of adhesive and covering the openings in the first layer of adhesive.

10. The circuit arrangement of claim 1, wherein the substrate is a rigid substrate.

11. The circuit arrangement of claim 2, wherein the flexible liner is a release liner.

12. The circuit arrangement of claim 2, wherein the flexible liner is permanently attached to the second layer of adhesive.

13. A method of making a circuit arrangement, comprising: attaching a first layer of adhesive to a substrate, the first layer of adhesive
covering bond pads and a pattern of conductors on a first surface of the substrate and having opposing first and second surfaces;

forming openings in the first layer of adhesive, the openings aligned with the bond pads, and the openings extending from the first surface of the first layer of adhesive to the second surface of the first layer of adhesive;

attaching an electronic device to the substrate by a surface of the electronic device in contact with the first layer of adhesive;

wires bonding the electronic device to the bond pads and disposed directly on the first layer of adhesive; and applying a second layer of adhesive that covers and is directly disposed on the first layer of adhesive, the bond pads and openings in the first layer of adhesive, the electronic device, and bond wires that connect the electronic device to the bond pads.

14. The method of claim 13, wherein the forming of the openings includes ablating portions of the first layer of adhesive using a laser, whereby the bond pads are exposed through the first layer of adhesive.

15. The method of claim 13, wherein the forming of the openings is performed before the attaching the first layer of adhesive to the substrate.

16. The method of claim 13, wherein the substrate is a flexible substrate and the method further comprising attaching a flexible liner to the second layer of adhesive.

17. The method of claim 13, wherein the first and second layers of adhesive include one of a pressure sensitive adhesive or a B-stage adhesive.

18. The method of claim 13, wherein the first layer of adhesive includes one of a pressure sensitive adhesive or a B-stage adhesive.

19. The method of claim 13, wherein the substrate is a rigid substrate.

20. The method of claim 16, wherein the flexible liner is a release liner.

21. The method of claim 16, further comprising permanently attaching the flexible liner to the second layer of adhesive.

* * * * *